United States Patent [19]

Alemanni

[11] Patent Number: 4,895,189
[45] Date of Patent: Jan. 23, 1990

[54] APPARATUS FOR STRAIGHTENING PIN GRID ARRAY LEADS

[75] Inventor: James C. Alemanni, Oceanside, Calif.

[73] Assignee: American Tech Manufacturing Corp., Erlanger, Ky.

[21] Appl. No.: 258,093

[22] Filed: Oct. 14, 1988

Related U.S. Application Data

[63] Continuation of Ser. No. 101,793, Sep. 28, 1987, abandoned.

[51] Int. Cl.⁴ ............................................. B21F 1/02
[52] U.S. Cl. .................................................. 140/147
[58] Field of Search ....................................... 140/147

[56] References Cited

U.S. PATENT DOCUMENTS

| | | | |
|---|---|---|---|
| 3,404,712 | 10/1968 | Suverkropp | 140/147 |
| 3,664,016 | 5/1972 | Sevc et al. | 140/147 |
| 4,219,053 | 8/1980 | Tyner et al. | 140/147 |
| 4,340,092 | 7/1982 | Chisholm | 140/147 |
| 4,371,013 | 2/1983 | Camp | 140/147 |
| 4,372,044 | 2/1983 | Chisholm | 140/147 |
| 4,397,341 | 8/1983 | Kent | 140/147 |
| 4,611,399 | 9/1986 | Tavares et al. | 140/147 |
| 4,643,234 | 2/1987 | Alemanni | 140/147 |
| 4,789,011 | 12/1988 | Moloney | 140/147 |

OTHER PUBLICATIONS

I.B.M. Technical Disclosure Bulletin; vol. 22, No. 3, Aug. 1979; "Precision Pin Straightening Comb" by Cioffi, Jr., J. G. Hatsios and G. Paegle; p. 1102; Classified in 140/147.

*Primary Examiner*—R. L. Spruill
*Attorney, Agent, or Firm*—Eugene E. Renz, Jr.

[57] ABSTRACT

An apparatus for straightening pin grid array leads includes a support guide for the grid leads and a plurality of laterally movable blades for extending between the leads and movable in both directions therebetween for engaging and bending the leads as they move in both lateral directions and then back to center alignment.

6 Claims, 3 Drawing Sheets

APPARATUS FOR STRAIGHTENING PIN GRID ARRAY LEADS

This is a continuation of copending application Ser. No. 101,793 filed on Sept. 28, 1987, now abandoned.

BACKGROUND OF THE INVENTION

The present invention relates to pin grid arrays and pertains particularly to an apparatus for accurately straightening the leads of a pin grid array.

A pin grid array device (PGA) comprises a body or substrate containing microelectric circuits, and a plurality of rows of snap pins extending outward perpendicular from a surface of the body for insertion into holes in a support structure for connecting to other electrical circuits or components. The pins or leads vary in length and are typically on the order of about twenty thousandths in diameter. The leads may vary in tensile strength but are fragile and easily bent out of alignment by routine handling in the manufacturing and/or testing thereof. It is necessary that the leads be very accurately aligned in order to fit into the mounting or socket therefor.

In my prior U.S. Pat. No. 4,643,234, I disclose a motor driven apparatus for efficiently straightening multiple leads of a pin grid array simultaneously. That apparatus, however, has some minor drawbacks. One such drawback is that some high tensile leads are often not accurately aligned.

SUMMARY AND OBJECTS OF THE INVENTION

It is the primary object of the present invention to provide an improved apparatus for straightening the leads of a pin grid array.

In accordance with a primary aspect of the invention, an apparatus for straightening the leads of a pin grid array device comprises support means for supporting a pin grid array in a fixed position with the leads thereof exposed, a carriage mounted for reciprocal movement along a linear path perpendicular to said leads, and means on said carriage for engaging alternate sides of said leads upon reciprocal movement of said carriage for forcing said leads into an aligned position.

BRIEF DESCRIPTION OF THE DRAWING

The above and other objects and advantages of the present invention will become apparent from the following description when read in conjunction with the accompanying drawings wherein.

DETAILED DESCRIPTION OF A PREFERRED EMBODIMENT

Figure 1:
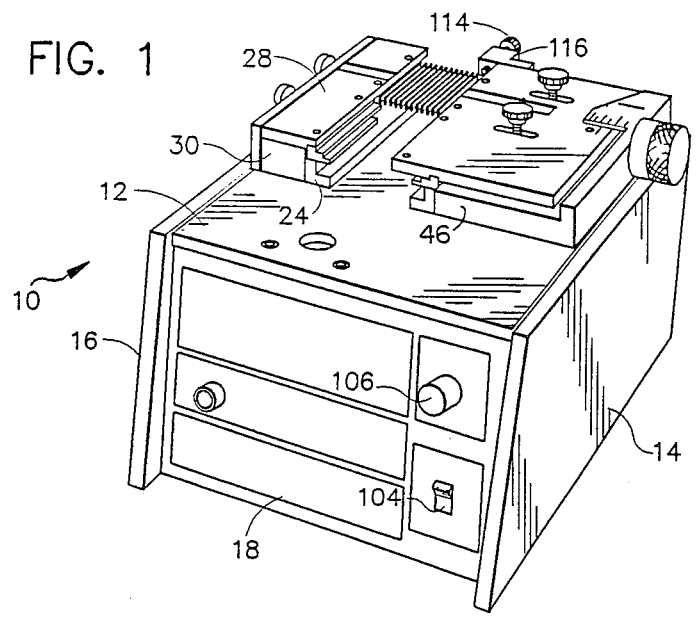
FIG. 1 is a perspective view illustrating a preferred embodiment of the invention.

Referring to FIG. 1 of the drawings, a pin grid array lead straightener in accordance with a preferred embodiment of the invention is illustrated, and designated generally by the numeral 10. The lead straightener, as illustrated, comprises a generally box-like housing supporting and enclosing the major working components of the system. The housing comprises a top support plate 12, a pair of side plates or panels 14 and 16, a front panel 18, a rear panel 20 and a bottom (not shown).

Figure 2:
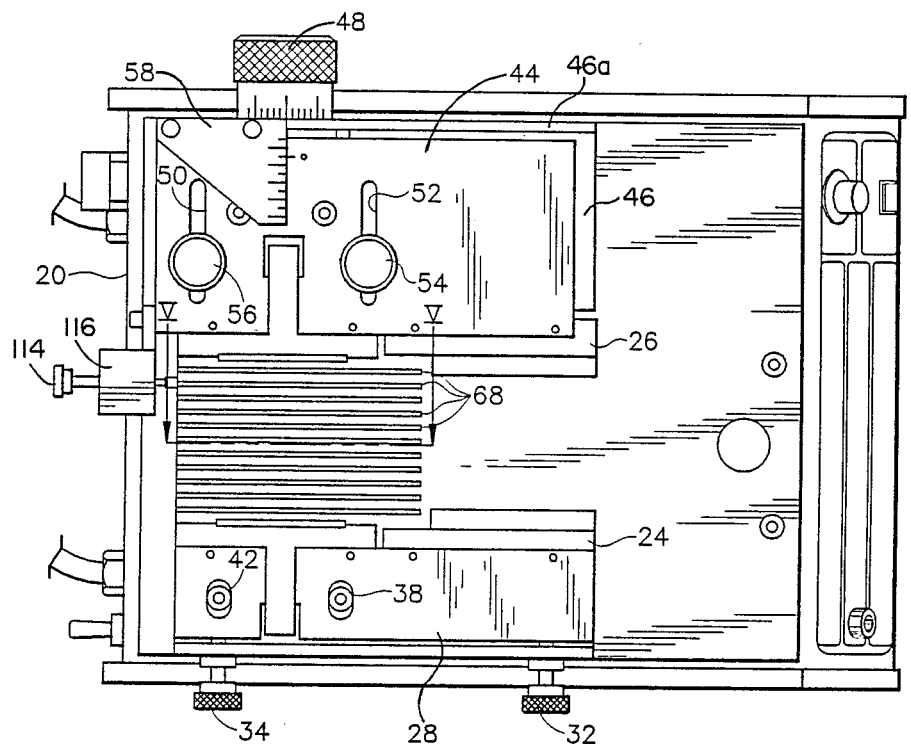
FIG. 2 is a top plan view of the embodiment of FIG. 1.
Figure 3:
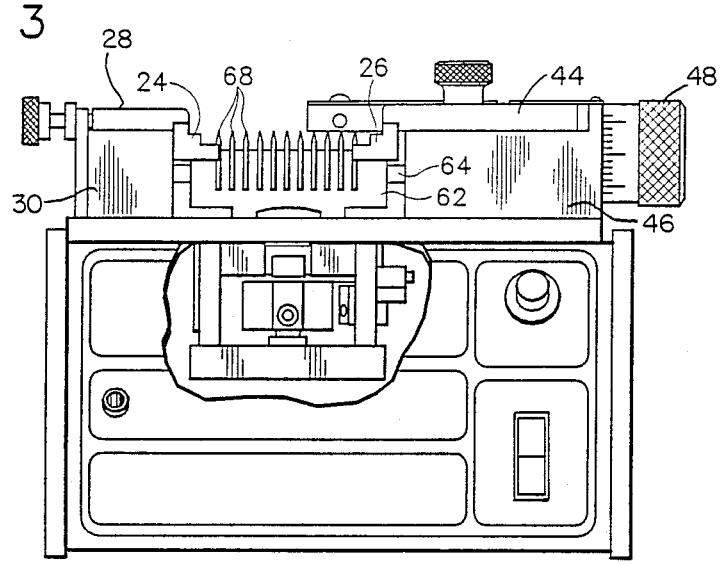
FIG. 3 is a front elevation view of the embodiment of FIG. 1 with portions broken away to reveal details.

The apparatus is designed to receive a pin grid array and by means of novel components and cooperation to automatically straighten the leads thereof. The apparatus comprises, as best seen in FIGS. 2 and 3, a support and guide assembly which comprises a pair of parallel spaced apart support and guide rails or members 24 and 26, shaped to receive the body of a pin grid array and to locate the pins thereof in proper position and alignment with a series of straightening blades.

The guide rails or members are each supported on an adjustable support structure. The guide rail 24 is designated a fixed rail and is normally fixed, but is adjustable to a degree for proper alignment, positioning, etc. The rail 24 is mounted on a plate 28, which in turn is mounted on a support block 30. The plate 28 is slideably mounted on the block 30, and is adjustable thereon by means of the pair of thumbscrews 32 and 34, which are threadably mounted in a vertical flange. A pair of machine screws 38 and 40 extend down through the bar 28 and clamp it to the support block 30. The support block 30 is secured directly to and fixed to the support panel or platform 12.

The support and guide rail 26 is designated as the movable or adjustable guide rail and is supported on a slideable plate or bar 44, which is slideably mounted on a stationary block 46, which includes an upwardly extending flange 46a. The block 46 is in turn secured and mounted directly to the top support panel 12. The plate 44 is slideably mounted on the block 46 and is movable by means of a micrometer adjustment hand wheel 48, which includes a threaded shaft (not shown) rotatably mounted in block 46. The threaded shaft threadably engages a threaded bore or nut on plate 44 positioned between the plate 44 and block 46. A pair of guide slots 50 and 52 are formed in and extend laterally of the plate 44 and receive thumbscrews 54 and 56, which releasably clamp the plate 44 to the support block 46. A micrometer scale 58 in combination with a scale on knob or wheel 48 enables one to predetermine a particular adjustment for a particular size pin grid array device.

Figure 7:
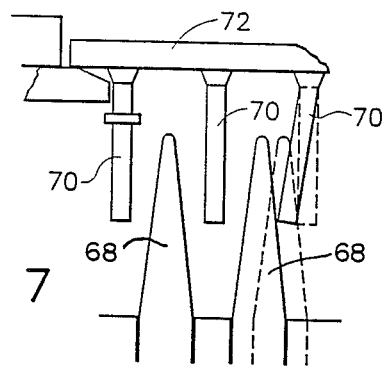
FIG. 7 is an enlarged detail view illustrating engagement of leads by the straightening blades.

Reciprocably mounted directly beneath the support and guide rail assembly is a reciprocable carriage 62, which is reciprocably mounted on a pair of guide pins or rods 64 and 66. The guide rails or pins 64 and 66 are mounted at opposite ends in blocks 30 and 46. Mounted in the upper surface of the carriage 62 in groves formed therein is a plurality of vertically oriented blades 68. The blades are each designed to extend between a row of leads preferably sufficient in number to accommodate the largest pin grid array available today. The blades are fixed in slots in the reciprocable carriage and are sharpened or beveled to an upper edge, as shown in FIG. 7. The blades taper to an upper edge which extend between the pins 70 of a pin grid array 72, as shown in FIG. 7.

The tapered blades enable the blades to extend between the pins and contact a pin at its outermost tip, as shown in FIG. 7, such that maximum leverage is achieved on the pin when pushing it from its displaced position back to its aligned position. The spacing between the blades 68 will be equal to that required for the normal pin grid array. The stroke of the carriage is such that it will exceed the spacing between rows of leads or pins by an amount to accommodate the spring back of the pins. Thus, the pins will be pushed in each direction beyond its aligned position an amount equal to the normal spring back of that pin, such that when the carriage or blades are retracted from the pins, the pins return to their properly aligned position. The spring back may vary, particularly if different materials are used for the pins. However, it will be the same for most standard pin grid arrays. Micro-adjust can compensate for the spring tensile variation.

Figure 4:
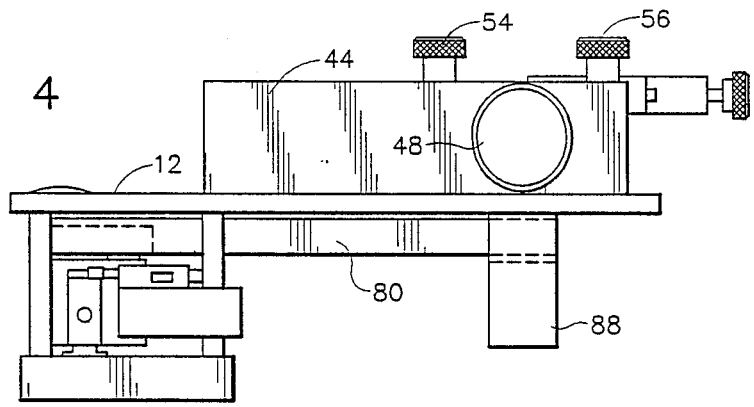
FIG. 4 is a side elevation view of the embodiment of FIG. 1 with the housing removed.
Figure 5:
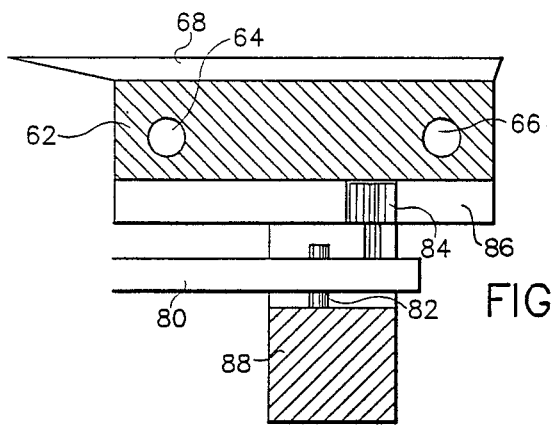
FIG. 5 is a section view on line V—V of FIG. 2.
Figure 6:
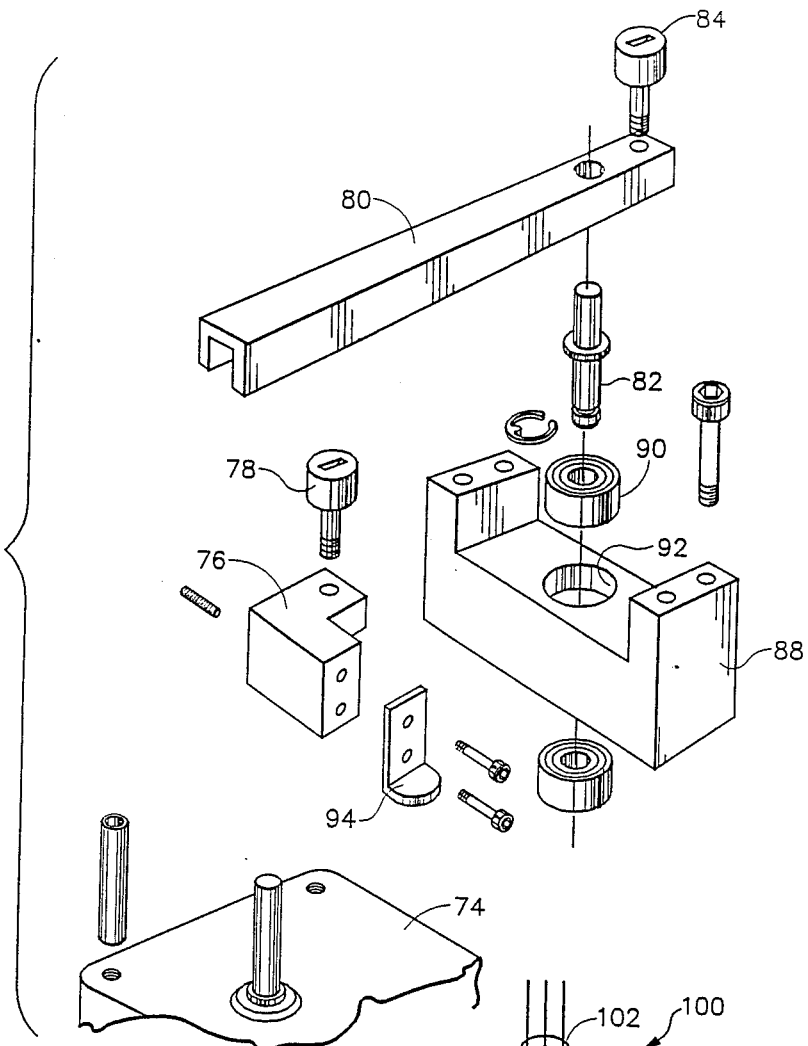
FIG. 6 is an exploded view of the drive linkage of FIG. 1.

Referring to FIGS. 4, 5 and 6, the carriage is oscillated by means of a drive linkage comprising a motor 74 mounted by suitable support means, such as bolts and the like, to plate 12 and drivingly connected by means of a drive linkage to the carriage. The drive linkage includes a crank and pin assembly comprising a crank 76, and an eccentric pin 78 on one arm of the crank engaging a slot or channel in a lever arm 80, which is pivotally mounted on pin 82 to the underside of the plate 12. The opposite end of the lever or drive arm 80 is connected by a drive pin 84 to a drive slot 86 on the underside of the carriage. The drive link 80 is mounted to have a leverage of approximately ten to one. Other leverages are possible. However, a leverage on this order is preferred in that it provides adequate leverage for a reasonable size motor and provides a reasonable movement of the carriage. Accuracy of blade reciprocation improved ten to one. (Example: Eccentric motion of $0.750 \pm 0.020 = 0.075 \pm 0.002$ at blade mechanism.)

Referring to FIG. 6, the pivot pin 82 is mounted in a bracket or yoke 88 suspended below the plate 12. A bearing 90 is mounted within a bore 92, within the yoke or block 88 for receiving the pin or shaft 82.

A cam 94 on the other arm of crank 76 deactivates the control circuit of the system to stop the motion of the carriage as will be described. The system includes a control circuit, as shown in FIG. 8, that is operative to cycle the system.

The circuit is designed for a single cycle operation, such that the table will oscillate between its extreme positions and stop at the center for each cycle. Thus, the leads in one orientation will be straightened with a single cycle. The pin grid array is then removed and reoriented such that the machine is again cycled to straighten the leads along the other orientation.

Figure 8:
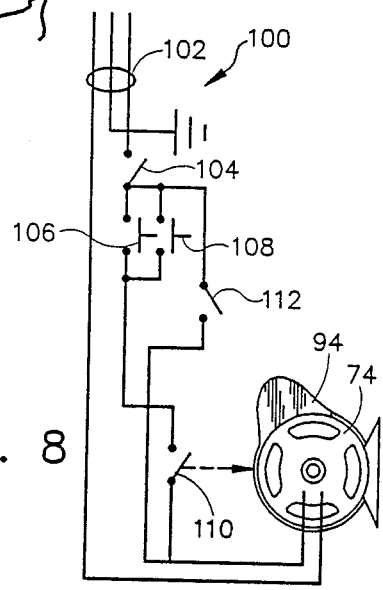
FIG. 8 is a schematic illustration of a circuit for the machine.

Referring to FIG. 8, the circuit comprises a three wire conductor 100, with a plug 102 for connecting to a source of electrical power, such as an AC outlet or the like, and includes a first conductor containing a fuse, a power switch 104, a run switch 106, which may also include a foot switch 108 or other switch in parallel, and a cam operated switch 110, which is normally closed but moved by the cam 94 to the open position to stop the motor. The conductor cable goes to the motor, and includes a second conductor parallel to the motor, with a jog switch 112 for quick activation/deactivation of the motor when needed.

In operation, the machine is set up to accommodate the particular size of a pin grid array. The adjustable support rail 26 is adjusted by loosening clamp screws 54 and 56, and rotating the micro-adjust knob 48 for adjusting the support rail 26 to a position to receive the pin grid array. The support rails 24 and 26 are designed to engage the outermost lead of the pin grid array on each side thereof (FIG. 7), such that it is set to the pin array and not to the body of the pin grid array device.

Once the support and guide rail 26 is properly positioned to accommodate the particular size pin grid array, the clamp screws 54 and 56 are tightened down to secure the rail in position. The pin grid array is then placed on the rails in front of the blades and pushed into the blade assembly above the blades, such that the leads extend between the blades (FIG. 7). A stop device, including a thumbscrew 114 in a block or bracket 116, as shown in FIG. 2, may be employed to stop the pin grid array device in position over the blades. Once the pin grid array device is in position, the run switch (pushbutton 106 or foot pedal 108) is activated or depressed and the cycle, with the carriage moving first to one side, then to the other, and then back to the center, engaging any bent leads and moving them to their proper aligned position, as shown in FIG. 7. The machine thus cycles one complete stroke from center to both sides and back to center for a given cycle. The pin grid array device is then removed, rotated ninety degrees and reinserted, and the machine again cycled.

What is claimed is:

1. Apparatus for straightening the leads of a pin grid array device having a base and a plurality of generally parallel rows of pins projecting from one face of the base comprising:

a carriage having a plurality of elongated generally parallel blades fixed along their length to said carriage and projecting from one face thereof having unsupported tips projecting from one end of the carriage, adjacent blades being spaced to engage between rows of pins;

a pair of spaced generally parallel guide rails located above the plane of the upper face of the blades to confront and confine opposing sides of the base of the device and extending parallel to the blades and means for rectilinearly reciprocating the carriage transversely relative to the guide rails through a cycle which displaces the rows of pins to both sides of a true vertical pin centerline and terminates at the center.

2. Apparatus claimed in claim 1 wherein at least one of said guide rails is adjustable toward and away from the other guide rail for accommodating different size pin grid arrays.

3. Apparatus as claimed in claim 1 wherein said carriage comprises a generally rectangular support member mounted for reciprocal movement on guide rails.

4. Apparatus as claimed in claim 1 wherein said means for reciprocating the carriage comprises drive means.

5. Apparatus as claimed in claim 4 wherein said drive means comprises electric motor means for driving said carriage and including electric control means for controlling said motor means for a single cycle of reciprocation of said carriage.

6. Apparatus as claimed in claim 5 wherein said drive means comprises a cam and lever drivingly connected to said carriage and said control means includes a cam actuated switch responsive to rotation of said motor for stopping said motor upon completing a cycle.

* * * * *